(12) United States Patent
Lin et al.

(10) Patent No.: US 12,489,048 B2
(45) Date of Patent: Dec. 2, 2025

(54) SEMICONDUCTOR PACKAGE DEVICE HAVING AT LEAST ONE SECOND METAL LINE BETWEEN TWO ADJACENT FIRST METAL LINES OF REDISTRIBUTION LAYER

(71) Applicant: InnoLux Corporation, Miao-Li County (TW)

(72) Inventors: Te-Hsun Lin, Miao-Li County (TW); Wen-Hsiang Liao, Miao-Li County (TW); Mei-Yen Chen, Miao-Li County (TW); Ming-Hsien Shih, Miao-Li County (TW); Yung-Feng Chen, Miao-Li County (TW); Cheng-Chi Wang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 439 days.

(21) Appl. No.: 18/145,198

(22) Filed: Dec. 22, 2022

(65) Prior Publication Data

US 2024/0170385 A1   May 23, 2024

(30) Foreign Application Priority Data

Nov. 17, 2022 (CN) .................. 202211460154.X (51) Int. Cl.
*H01L 23/498* (2006.01)
*H01L 23/31* (2006.01)

(52) U.S. Cl.
CPC .... *H01L 23/49838* (2013.01); *H01L 23/3128* (2013.01); *H01L 23/49816* (2013.01); *H01L 23/49822* (2013.01); *H01L 2924/15174* (2013.01)

(58) Field of Classification Search
CPC .......... H01L 23/49838; H01L 23/3128; H01L 23/49816; H01L 23/49822
See application file for complete search history.

(56) References Cited

U.S. PATENT DOCUMENTS

| 8,952,551 | B2 | 2/2015 | Hisada et al. | |
| 9,780,057 | B2 | 10/2017 | Pendse | |
| 10,553,526 | B2 | 2/2020 | Hsu et al. | |
| 2021/0183789 | A1* | 6/2021 | Lin | H01L 23/5386 |
| 2021/0368615 | A1* | 11/2021 | Snir | H05K 1/0251 |

(Continued)

FOREIGN PATENT DOCUMENTS

| CN | 102487021 B | 10/2015 |
| CN | 103367293 B | 3/2017 |

*Primary Examiner* — Michael Jung
(74) *Attorney, Agent, or Firm* — McClure, Qualey & Rodack, LLP (57) ABSTRACT

A semiconductor package device is provided. The semiconductor package device includes a chip and a redistribution layer disposed on the chip and electrically connected to the chip. The redistribution layer includes a plurality of first metal lines and a plurality of second metal lines, wherein at least one of the second metal lines is disposed between two adjacent first metal lines. The included angle between the at least one of the second metal lines and the two adjacent first metal lines is greater than or equal to 0 degrees and less than or equal to 10 degrees. The first width of one of the two adjacent first metal lines is greater than the second width of the at least one of the second metal lines.

19 Claims, 4 Drawing Sheets

(56) References Cited

U.S. PATENT DOCUMENTS

| | | | |
|---|---|---|---|
| 2021/0408976 A1* | 12/2021 | Lim | H01L 24/05 |
| 2022/0238421 A1* | 7/2022 | Quinones | H01L 23/49524 |
| 2022/0392833 A1* | 12/2022 | Baek | H01L 23/3107 |
| 2023/0085067 A1* | 3/2023 | Bishop | H01L 21/485 |
| | | | 257/786 |

* cited by examiner

SEMICONDUCTOR PACKAGE DEVICE HAVING AT LEAST ONE SECOND METAL LINE BETWEEN TWO ADJACENT FIRST METAL LINES OF REDISTRIBUTION LAYER

CROSS REFERENCE TO RELATED APPLICATIONS

This application claims priority of China Patent Application No. 202211460154.X, filed on Nov. 17, 2022, the entirety of which is incorporated by reference herein.

BACKGROUND

Technical Field

The present disclosure relates to an electronic device, and in particular it relates to a semiconductor package device that protects a signal routing with a specific circuit structure.

Description of the Related Art

A redistribution layer (RDL) of a fan-out packaging chip needs to straddle between a chip and a packaging material, causing the signal routing of the redistribution layer to bear greater stress in a heterojunction region, resulting in delamination or cracking of the lines of the redistribution layer.

SUMMARY

In accordance with one embodiment of the present disclosure, a semiconductor package device is provided. The semiconductor package device includes a chip and a redistribution layer disposed on the chip and electrically connected to the chip. The redistribution layer includes a plurality of first metal lines and a plurality of second metal lines, wherein at least one of the second metal lines is disposed between two adjacent first metal lines. The included angle between the at least one of the second metal lines and the two adjacent first metal lines is greater than or equal to 0 degrees and less than or equal to 10 degrees. The first width of one of the two adjacent first metal lines is greater than the second width of the at least one of the second metal lines.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that in accordance with standard practice in the industry, various features are not drawn to scale. In fact, the dimensions of the various features may be arbitrarily increased or reduced for clarity of discussion.

DETAILED DESCRIPTION

Various embodiments or examples are provided in the following description to implement different features of the present disclosure. The elements and arrangement described in the following specific examples are merely provided for introducing the present disclosure and serve as examples without limiting the scope of the present disclosure. For example, when a first component is referred to as "on a second component", it may directly contact the second component, or there may be other components in between, and the first component and the second component do not come in direct contact with one another.

It should be understood that additional operations may be provided before, during, and/or after the described method. In accordance with some embodiments, some of the stages (or steps) described below may be replaced or omitted.

In this specification, spatial terms may be used, such as "below", "lower", "above", "higher", "on" and similar terms, for briefly describing the relationship between an element relative to another element in the figures. Besides the directions illustrated in the figures, the devices may be used or operated in different directions. When the device is turned to different directions (such as rotated 45 degrees or other directions), the spatially related adjectives used in it will also be interpreted according to the turned position. In addition, in this specification, expressions such as "first material layer disposed above/on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer. In some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Herein, the terms "about", "around" and "substantially" typically mean a value is in a range of +/−15% of a stated value, typically a range of +/−10% of the stated value, typically a range of +/−5% of the stated value, typically a range of +/−3% of the stated value, typically a range of +/−2% of the stated value, typically a range of +/−1% of the stated value, or typically a range of +/−0.5% of the stated value.

It should be understood that, although the terms "first", "second", "third", etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer, portion or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

Figure 1:
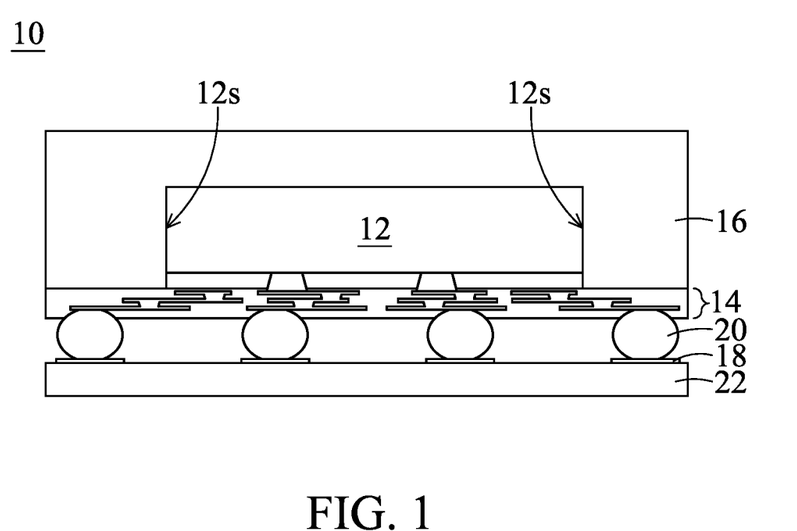
FIG. 1 shows a cross-sectional view of a semiconductor package device in accordance with one embodiment of the present disclosure.
Figure 2:
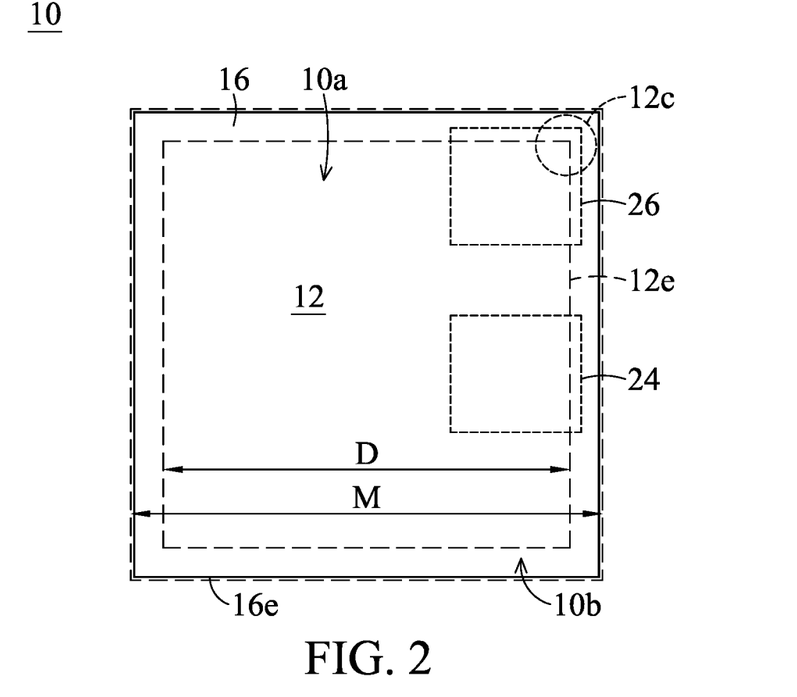
FIG. 2 shows a top view of a semiconductor package device in accordance with one embodiment of the present disclosure.

Referring to FIGS. 1 and 2, in accordance with one embodiment of the present disclosure, a semiconductor package device 10 is provided. FIG. 1 is the cross-sectional view of the semiconductor package device 10. FIG. 2 is the top view of the semiconductor package device 10. In the present disclosure, the semiconductor package device 10 may include antenna devices, display devices, radar devices, lidar devices, packaging components, packaging modules, etc., but the present disclosure is not limited thereto. The packaging component may include, for example, system-in-package (SiP) architectures or system-on-chip (SoC) architectures, but the present disclosure is not limited thereto. The semiconductor package device 10 may be applied to, for example, wafer-level packaging (WLP) or panel-level packaging (PLP). The packaging methods may include, for example, chip-first packaging methods or redistribution layer (RDL)-first packaging methods, but the present disclosure is not limited thereto. It should be noted that an electronic device may include any combination of the above-mentioned structures, but the present disclosure is not limited thereto.

As shown in FIG. 1, the semiconductor package device 10 includes a chip 12, a redistribution layer (RDL) 14 and a protective layer 16. The redistribution layer 14 is disposed corresponding to the chip 12 and electrically connected to the chip 12. For example, the redistribution layer 14 is disposed on the chip 12 or the redistribution layer 14 is disposed under the chip 12. The protective layer 16 surrounds the chip 12. For example, from a top view, the protective layer 16 at least contacts the two sides 12s of the chip 12. In accordance with some embodiments, the semiconductor package device 10 may further include bumps disposed on the redistribution layer 14. The chip 12 may be electrically connected to an electronic component 22 through the redistribution layer 14, the bumps 20 and bonding pads 18 to form an electronic device. In some embodiments, the redistribution layer 14 may include an insulating layer and a conductive layer stacked alternately, and may further include, for example, thin-film transistors (TFTs) (including gate/source/drain/semiconductor layers), resistive components, capacitive components or inductive components, but the present disclosure is not limited thereto, other suitable components may also be included in the redistribution layer 14. In some embodiments, the conductive layer of the redistribution layer 14 contacting the bumps 20 may be used as an under bump metallization (UBM). In some embodiments, the protective layer 16 may include epoxy molding compound (EMC), but not limited to. In some embodiments, the bumps 20 may include solder balls, anisotropic conductive film (ACF), copper pillars or other suitable bumps, but the present disclosure is not limited thereto. In some embodiments, the electronic component 22 may include, for example, printed circuit board (PCB), resistive components, capacitive components, inductive components, antenna components, circuit components or drive circuit components, but the present disclosure is not limited thereto, other suitable electronic components are also suitable for the present disclosure. The circuit components or drive circuit components may include semiconductor materials or thin-film transistors, but the present disclosure is not limited thereto.

From FIG. 2, the semiconductor package device 10 includes a chip region 10a and a package region 10b. The chip region 10a is adjacent to the package region 10b, or the chip region 10a is located in the package region 10b, or the package region 10b surrounds the chip region 10a. The chip region 10a may be defined by the edge 12e of the chip 12. The package region 10b may be defined by the edge 16e of protective layer 16. The detailed structure of the redistribution layer 14 in a first region 24 and a second region 26 in FIG. 2 will be described respectively with FIGS. 3 to 5, for example, the configuration and size relationship between the signal routing and the protective structure in the redistribution layer 14.

Figure 3:
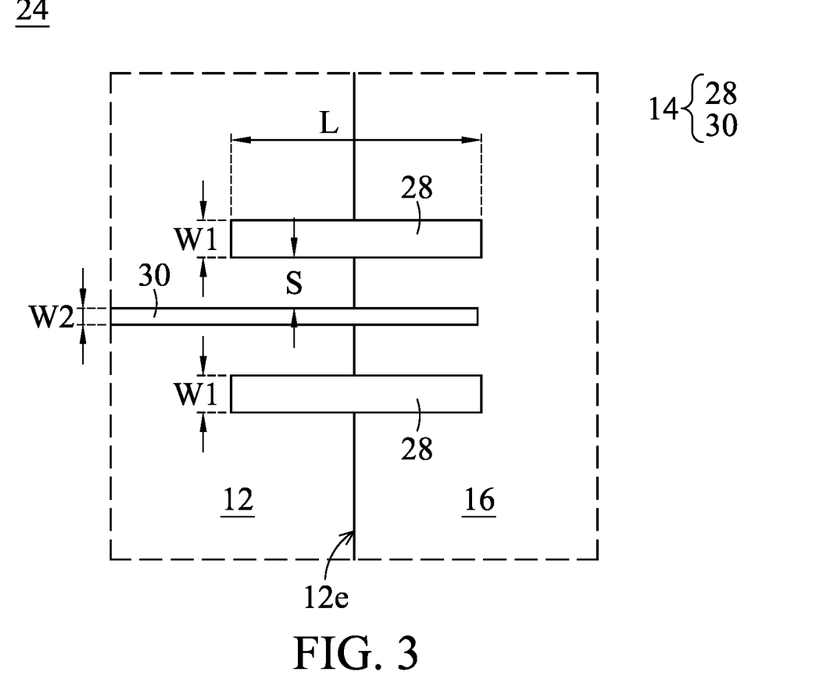
FIG. 3 shows a top view of a partial region of a semiconductor package device in accordance with one embodiment of the present disclosure.

Referring to FIG. 3, in accordance with one embodiment of the present disclosure, the detailed structure of the redistribution layer 14 in the partial region of the semiconductor package device 10 is described. FIG. 3 shows the top view of the partial region (as the first region 24 in FIG. 2) of the semiconductor package device 10. According to FIG. 2, the first region 24 spans between the chip 12 and the protective layer 16, for example, the first region 24 spans the edge 12e of the chip 12.

In the present disclosure, the redistribution layer 14 may include a plurality of first metal lines 28 (may be used as the protective structures) and a plurality of second metal lines 30 (may be used as the signal routings). Referring to FIG. 3, the configuration that a single second metal line 30 and two first metal lines 28 on the both sides of the second metal line 30 is taken as an example for illustration. The number of the first metal lines 28 and the second metal lines 30 in the redistribution layer 14 may be adjusted according to product requirements, as long as the second metal line 30 is disposed between two first metal lines 28. In FIG. 3, the second metal line 30 is disposed between two adjacent first metal lines 28. The second metal line 30 and the two adjacent first metal lines 28 straddle between the chip 12 and the protective layer 16. That is, the second metal line 30 and the two adjacent first metal lines 28 pass through the edge 12e of the chip 12 and extend towards the bottom of the protective layer 16, or in other words, the chip 12 overlaps a part of the first metal line 28, the protective layer 16 overlaps another part of the first metal line 28, and the part of the first metal line 28 is connected to the other part of the first metal line 28. In some embodiments, the second metal lines 30 in the redistribution layer 14 are electrically connected to the chip 12.

In some embodiments, the included angle between the second metal line 30 and two adjacent first metal lines 28 is greater than or equal to about 0 degrees and less than or equal to about 10 degrees. That is, the second metal line 30 is substantially parallel to the at least one of the two adjacent first metal lines 28. More detail, an extension line of the first metal lines 28 is substantially parallel to an extension line of the second metal lines 30. The first width W1 of one of the two adjacent first metal lines 28 is greater than the second width W2 of the second metal line 30. In some embodiments, the first width W1 of the first metal line 28 is approximately greater than or equal to twice the second width W2 of the second metal line 30. In some embodiments, the first width W1 of the first metal line 28 is approximately greater than or equal to twice the second width W2 of the second metal line and approximately less than or equal to three times the second width W2 of the second metal line 30. Through the above design, it provides protection or prevents the structural stress of the first metal line 28 from being too strong to affect the metal line 30, thereby affecting the electrical properties or signal quality, but the present disclosure is not limited thereto. In some embodiments, the distance S between the second metal line 30 and one of two adjacent first metal lines 28 is approximately greater than or equal to twice the second width W2 of the second metal line 30. In some embodiments, the distance S between the second metal line 30 and one of two adjacent first metal lines 28 is approximately greater than or equal to twice the second width W2 of the second metal line 30 and approximately less than or equal to three times the second width W2 of the second metal line 30. Through the above design, it provides at least twice the buffer spacing to avoid the mutual influence between the metal line 30 and the metal line 28, or avoids excessive buffer spacing, causing the metal line 28 to have no protective effect, but the present disclosure is not limited thereto. In some embodiments, the length L of one of the two adjacent first metal lines 28 is approximately greater than or equal to 16 times the second width W2 of the second metal line 30 (for example, 16*W2<L). In some embodiments, the length L of one of the two adjacent first metal lines 28 is approximately greater than or equal to 16 times the second width W2 of the second metal line 30 and approximately less than or equal to 20 times the second width W2 of the second metal line 30. Through the above design, it is possible to ensure that the metal line 28 has a protective effect across the chip 12 and the protective layer 16, or to prevent the metal line 28 from being too long to affect the structural stress, occupying space and causing waste, or generating parasitic capacitance to affect the electrical quality, but the present disclosure is not limited thereto. In some embodiments, the above-mentioned widths may be measured by, for example, an optical microscope (OM), a scanning electron microscope (SEM) or other suitable measurement methods. The measurement direction is the extension direction perpendicular to the metal line.

In some embodiments, two adjacent first metal lines 28 comprise ground routings. In some embodiments, two adjacent first metal lines 28 may comprise dummy structures, for example, metal structures not electrically connected to other devices or components. In some embodiments, the second metal line 30 and two adjacent first metal lines 28 may be located in the same layer of the redistribution layer 14. In some embodiments, the second metal line and two adjacent first metal lines 28 may be formed in the same process step. In accordance with some embodiments of the present disclosure, the method of forming the redistribution layer 14 may be, for example, electroplating, photolithography, etching, physical vapor deposition (PVD), chemical vapor deposition (CVD), combinations of the above, or other suitable manufacturing methods, but the present disclosure is not limited thereto.

Figure 4:
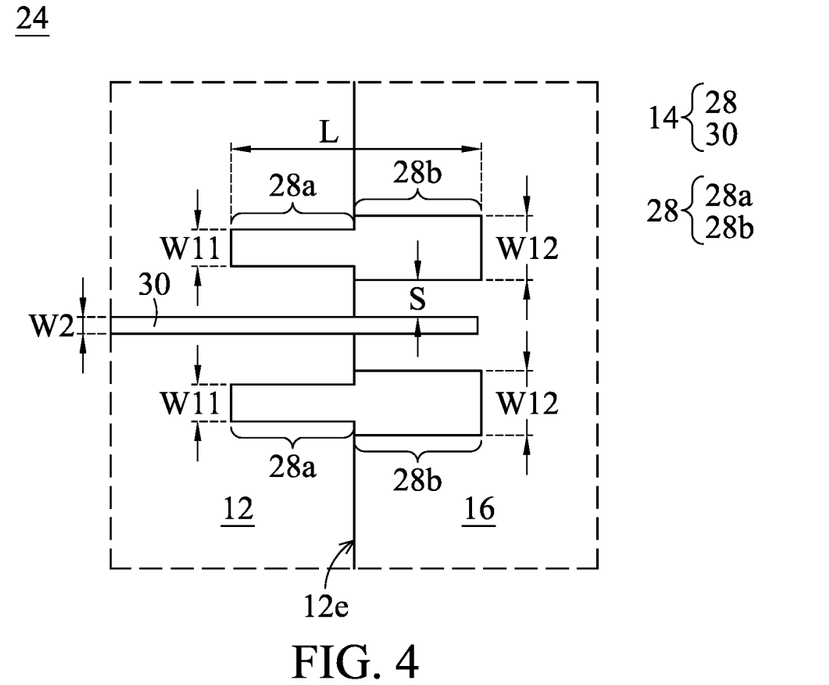
FIG. 4 shows a top view of a partial region of a semiconductor package device in accordance with one embodiment of the present disclosure.

Referring to FIG. 4, in accordance with one embodiment of the present disclosure, the detailed structure of the redistribution layer 14 in the partial region of the semiconductor package device 10 is described. FIG. 4 shows the top view of the partial region (as the first region 24 in FIG. 2) of the semiconductor package device 10.

Here (FIG. 4), the configuration that a single second metal line 30 and two first metal lines 28 located on the both sides of the second metal line 30 is taken as an example for illustration. The main difference between the embodiment disclosed in FIG. 4 and the embodiment disclosed in FIG. 3 lies in the structure of the first metal line 28. Other parts similar to those in FIG. 3 will not be repeated here. In FIG. 4, one of the two adjacent first metal lines 28 has a first portion 28a and a second portion 28b. The second portion 28b is connected to the first portion 28a. The first portion 28a overlaps the chip 12. The second portion 28b overlaps to protective layer 16. The width of the first portion 28a is different from that of the second portion 28b. In some embodiments, the width W12 of the second portion 28b is greater than the width W11 of the first portion 28a. The above design reduces or slows down the delamination or cracking of the signal routings in the redistribution layer (RDL) due to high stress in the heterojunction region, thereby improving reliability, but the present disclosure is not limited thereto.

In some embodiments, the included angle between the second metal line 30 and two adjacent first metal lines 28 is greater than or equal to about 0 degrees and less than or equal to about 10 degrees. That is, the second metal line 30 is substantially parallel to the two adjacent first metal lines 28. The width W12 of the second portion 28b of one of the two adjacent first metal lines 28 is greater than the second width W2 of the second metal line 30. In some embodiments, the width W12 of the second portion 28b of the first metal line 28 is approximately greater than or equal to twice the second width W2 of the second metal line 30. In some embodiments, the width W12 of the second portion 28b of the first metal line 28 is approximately greater than or equal to twice the second width W2 of the second metal line and approximately less than or equal to three times the second width W2 of the second metal line 30. Through the above design, it provides protection or prevents the structural stress of the first metal line 28 from being too strong to affect the metal line 30, thereby affecting the electrical properties or signal quality, but the present disclosure is not limited thereto. In some embodiments, the distance S between the second metal line 30 and the second portion 28b of two adjacent first metal lines 28 is approximately greater than or equal to twice the second width W2 of the second metal line 30. In some embodiments, the distance S between the second metal line 30 and the second portion 28b of two adjacent first metal lines 28 is approximately greater than or equal to twice the second width W2 of the second metal line 30 and approximately less than or equal to four times the second width W2 of the second metal line 30. Through the above design, it provides at least twice the buffer spacing to avoid the mutual influence between the metal line 30 and the metal line 28, or avoids excessive buffer spacing, causing the metal line 28 to have no protective effect, but the present disclosure is not limited thereto. In some embodiments, the length L of one of the two adjacent first metal lines 28 is approximately greater than or equal to 16 times the second width W2 of the second metal line 30. In some embodiments, the length L of one of the two adjacent first metal lines 28 is approximately greater than or equal to 16 times the second width W2 of the second metal line 30 and approximately less than or equal to 20 times the second width W2 of the second metal line 30.

Figure 5:
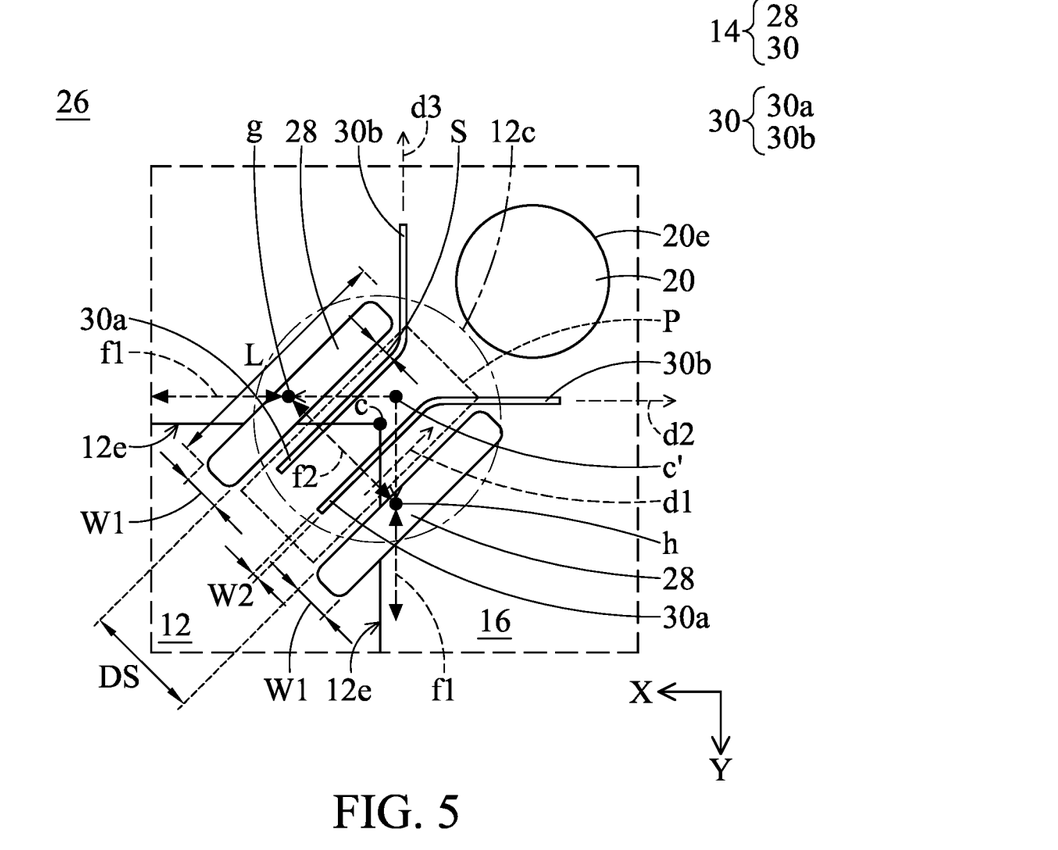
FIG. 5 shows a top view of a partial region of a semiconductor package device in accordance with one embodiment of the present disclosure.

Referring to FIG. 5, in accordance with one embodiment of the present disclosure, the detailed structure of the redistribution layer 14 in the partial region of the semiconductor package device 10 is described. FIG. 5 shows the top view of the partial region (as the second region 26 in FIG. 2) of the semiconductor package device 10. According to FIG. 2, the second region 26 spans between the chip 12 and the protective layer 16, for example, the second region 26 spans the corner 12*c* of the chip 12.

Here (FIG. 5), the configuration that two first metal lines 28 and a plurality of second metal lines 30 located between the two first metal lines 28 is taken as an example for illustration. In FIG. 5, the plurality of second metal lines 30 are disposed between two adjacent first metal lines 28, and the plurality of second metal lines 30 and the two adjacent first metal lines 28 span between the chip 12 and the protective layer 16. For example, the plurality of second metal lines 30 and the two adjacent first metal lines 28 pass through the corner 12*c* of the chip 12 and extend towards the bottom of the protective layer 16. On the other hand, the plurality of second metal lines 30 extending below the protective layer 16 and the two adjacent first metal lines 28 do not overlap the bumps 20. That is, the plurality of second metal lines 30 extending below the protective layer 16 and the two adjacent first metal lines 28 avoid the edge 20*e* of the bumps 20. In addition, the edge 12*e* of the chip 12 does not overlap the bumps 20. In some embodiments, the second metal lines 30 in the redistribution layer 14 are electrically connected to the chip 12.

According to the stress analysis, it can be understood that in the second region 26 of the semiconductor package device 10 shown in FIG. 5, the generated structural stress includes, for example, the tensile stress f1 generated along the edge 12*e* of the chip 12 and the tensile stress f2 generated at the corner 12*c* of the chip 12 due to the stresses pulling each other. Through simulation analysis, it can be seen that the end point c' in the figure (for example, adjacent to the corner c of the chip 12) extends a distance of ⅟25 of the chip length along the edge 12*e* of the chip 12 in direction x and direction y to, for example, the end points g and h, and then the extension direction obtained by connecting the two end points g and h is approximately the position (that is, the position at an angle of about 45 degrees with the edge 12*e* of the chip 12) where the tensile stress f2 occurs, as shown in FIG. 5. At this time, if the first metal lines 28 are disposed in the extending direction perpendicular to the tensile stress f2, they can effectively block the damage of the tensile stress f2 to the second metal lines 30. In FIG. 5, two adjacent first metal lines 28 disposed outside the second metal lines as a protective structure constitute a protective range P. The protective range P may be defined by the region enclosed by the extension distance DS of the tensile stress f2 and the length L of the first metal line 28.

In some embodiments, the second metal line 30 includes a first portion 30*a* and a second portion 30*b*. The second portion 30*b* is connected to the first portion 30*a*. The first portion 30*a* extends along a first direction d1. The second portion 30*b* extends along a second direction d2 or a third direction d3. The first direction d1 is different from the second direction d2 and the third direction d3. As shown in FIG. 5, the second portion 30*b* of the second metal line 30 extends in a direction (for example, the second direction d2 or the third direction d3) that is different from the first direction d1 so as to avoid the edge 20*e* of the bumps 20 and not overlap with the bumps 20. In some embodiments, the included angle between the first portion 30*a* of the second metal line 30 and at least one of the two adjacent first metal lines 28 is greater than or equal to about 0 degrees and less than or equal to about 10 degrees. That is, the first portion 30*a* of the second metal line 30 is substantially parallel to the two adjacent first metal lines 28. The first width W1 of one of the two adjacent first metal lines 28 is greater than the second width W2 of the second metal line 30. In some embodiments, the first width W1 of the first metal line 28 is approximately greater than or equal to twice the second width W2 of the second metal line 30. In some embodiments, the first width W1 of the first metal line 28 is approximately greater than or equal to twice the second width W2 of the second metal line 30 and approximately less than or equal to three times the second width W2 of the second metal line 30. In some embodiments, the distance S between the first portion 30*a* of the second metal line 30 and two adjacent first metal lines 28 is approximately greater than or equal to twice the second width W2 of the second metal line 30. In some embodiments, the distance S between the first portion 30*a* of the second metal line 30 and two adjacent first metal lines 28 is approximately greater than or equal to twice the second width W2 of the second metal line 30 and approximately less than or equal to four times the second width W2 of the second metal line 30. In some embodiments, the length L of one of the two adjacent first metal lines 28 is approximately greater than or equal to 16 times the second width W2 of the second metal line 30. In some embodiments, the length L of one of the two adjacent first metal lines 28 is approximately greater than or equal to 16 times the second width W2 of the second metal line 30 and approximately less than or equal to 20 times the second width W2 of the second metal line 30. Since the stress generated at the corner 12*c* is greater than that generated at the edge 12*e* of the chip 12, the first width W1 of the first metal line 28 disposed across the corner 12*c* in FIG. 5 may be greater than or equal to the first width W1 of the first metal line 28 disposed across the edge 12*e* in FIG. 3.

In some embodiments, two adjacent first metal lines 28 may be ground routings. In some embodiments, two adjacent first metal lines 28 may be dummy structures, for example, metal structures not electrically connected to other devices or components. In addition, the first metal lines 28 have curved corners to prevent, for example, tip discharges or breaks in the insulating layer. In some embodiments, the second metal line 30 and two adjacent first metal lines 28 are located in the same layer of the redistribution layer 14. In some embodiments, the second metal line 30 and two adjacent first metal lines 28 may be formed in the same process step.

Figure 6:
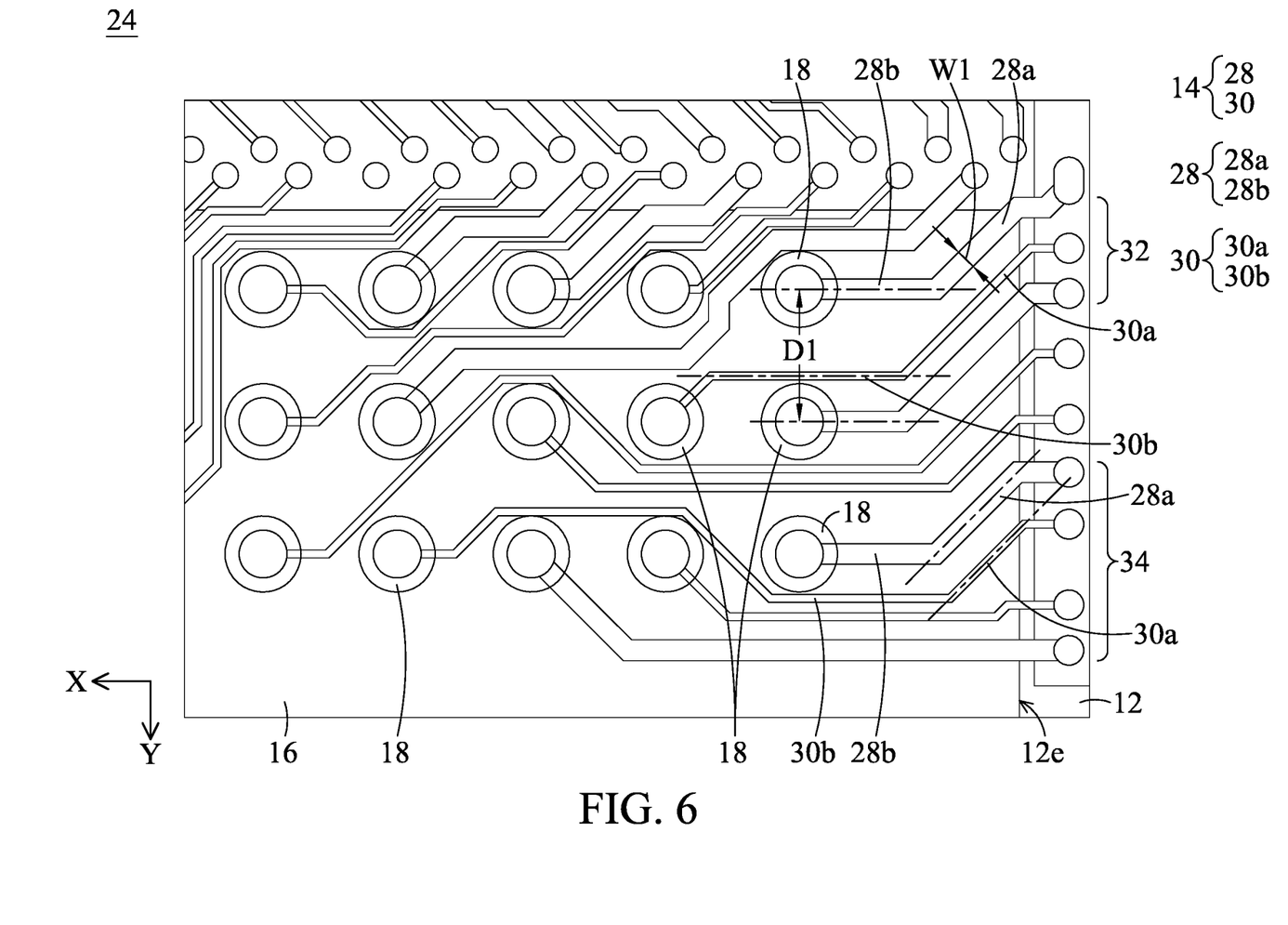
FIG. 6 shows a top view of a partial region of a semiconductor package device in accordance with one embodiment of the present disclosure.

Referring to FIG. 6, in accordance with one embodiment of the present disclosure, the detailed structure of the redistribution layer 14 in the partial region of the semiconductor package device 10 is described. FIG. 6 shows the top view of the partial region (as the first region 24 in FIG. 2) of the semiconductor package device 10.

Here (FIG. 6), the combination of two groups (for example, the first group 32 and the second group 34) of the second metal lines 30 (signal routings) and the first metal lines 28 (protection structures) is taken as an example for illustration. Each group of combination includes a single second metal line 30 and two first metal lines 28 located on the both sides of the second metal line 30. The second metal line 30 is disposed between two adjacent first metal lines 28. The second metal line 30 and the two adjacent first metal lines 28 span between the chip 12 and the protective layer 16. That is, the second metal line 30 and the two adjacent first metal lines 28 pass through the edge 12*e* of the chip 12 and extend below the protective layer 16. On the other hand, the terminals of the second metal line 30 extending below the protective layer 16 and the two adjacent first metal lines 28 are connected to the bonding pads 18. That is, the bonding pads 18 are disposed corresponding to the ends of the first metal lines 28 and the second metal lines 30. For example, the bonding pads 18 are overlapped with the ends of the first metal lines 28 and the second metal lines 30. In some embodiments, the second metal lines 30 in the redistribution layer 14 are electrically connected to the chip 12.

In some embodiments, the distance D1 between two adjacent bonding pads 18 is approximately greater than or equal to 4 times the first width W1 of the first metal line 28 and approximately less than or equal to 8 times the first width W1 of the first metal line 28. The bonding pads 18 may be arranged along the X direction or the Y direction. A distance between two adjacent bonding pads 18 in the X direction or the Y direction is defined as D1. Through the above design, a sufficient protective space is provided to consolidate the metal line 30b, and it is approximately less than or equal to 8 times the first width W1 of the first metal line 28, so as to avoid losing the effect of protecting the metal line 30b due to an excessively large space, but the present disclosure is not limited thereto. In FIG. 6, the first metal line 28 includes a first portion 28a and a second portion 28b, and the second portion 28b is connected to the first portion 28a. The second metal line 30 includes a first portion 30a and a second portion 30b, and the second portion 30b is connected to the first portion 30a. The combination of the first group 32 is taken as an example. Comparing the second portion 30b of the second metal line 30 with the second portion 28b of two adjacent first metal lines 28, the angle between the two is greater than or equal to about 0 degrees and less than or equal to about 10 degrees. That is, the second portion 30b of the second metal line 30 is substantially parallel to the second portion 28b of the two adjacent first metal lines 28. The combination of the second group 34 is taken as an example. Comparing the first portion 30a of the second metal line 30 with the first portion 28a of two adjacent first metal lines 28, the angle between the two is greater than or equal to about 0 degrees and less than or equal to about 10 degrees. That is, the first portion 30a of the second metal line 30 is substantially parallel to the first portion 28a of the two adjacent first metal lines 28. It can be seen that when describing that the second metal line 30 is substantially parallel to two adjacent first metal lines 28 (for example, the angle between the two is greater than or equal to about 0 degrees and less than or equal to about 10 degrees), the comparison is made between the line segments extending in the same direction in the second metal line 30 and the two adjacent first metal lines 28.

In addition to being applicable to semiconductor package devices, the disclosed technology may also be applied to, for example, display devices, light-emitting devices, solar cells, sensing devices, automotive electronic devices, or other electronic devices such as antennas.

In order to solve the situation that the signal routings of the redistribution layer (RDL) are subjected to high stress in the heterojunction region and cause delamination or cracking of the lines, in the present disclosure, when designing the circuit structure, a specific circuit structure (for example, ground routings or dummy structures) is added on the both sides of the signal routings in the redistribution layer of the semiconductor package device to protect the signal routings. The present design manner improves stress matching, increases the circuit structure strength of the overall redistribution layer, reduces delamination or cracking of the redistribution layer, and improves the reliability of semiconductor package devices.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A semiconductor package device, comprising:
a chip;
a redistribution layer disposed corresponding to the chip and electrically connected to the chip, wherein the redistribution layer comprises a plurality of first metal lines and a plurality of second metal lines,
wherein, from a top view, at least one of the second metal lines is disposed between two adjacent first metal lines, an included angle between the at least one of the second metal lines and the two adjacent first metal lines is greater than or equal to 0 degrees and less than or equal to 10 degrees, and a first width of one of the two adjacent first metal lines is greater than a second width of the at least one of the second metal lines; and
a plurality of bonding pads corresponding to terminals of the first metal lines and the second metal lines, and a distance between two adjacent bonding pads is greater than or equal to 4 times the first width and less than or equal to 8 times the first width.

2. The semiconductor package device as claimed in claim 1, wherein the first metal lines comprise ground routings.

3. The semiconductor package device as claimed in claim 1, wherein the first width is greater than or equal to twice the second width.

4. The semiconductor package device as claimed in claim 3, wherein the first width is greater than or equal to twice the second width and less than or equal to three times the second width.

5. The semiconductor package device as claimed in claim 1, wherein the at least one of the second metal lines is electrically connected to the chip.

6. The semiconductor package device as claimed in claim 1, wherein one of the two adjacent first metal lines has a first portion and a second portion, the second portion connects to the first portion, the first portion overlaps the chip, and the first portion and the second portion have different widths.

7. The semiconductor package device as claimed in claim 1, further comprising a protective layer surrounding the chip.

8. The semiconductor package device as claimed in claim 7, wherein the protective layer contacts at least two sides of the chip.

9. The semiconductor package device as claimed in claim 7, wherein the at least one of the second metal lines and the two adjacent first metal lines straddle between the chip and the protective layer.

10. The semiconductor package device as claimed in claim 7, wherein the protective layer comprises epoxy molding compound (EMC).

11. The semiconductor package device as claimed in claim 1, further comprising a plurality of bumps disposed on the redistribution layer.

12. The semiconductor package device as claimed in claim 11, further comprising an electronic component electrically connected to the chip through the redistribution layer, the bumps and the bonding pads.

13. The semiconductor package device as claimed in claim 12, wherein the electronic component comprises a printed circuit board (PCB), resistive components, capacitive components, inductive components, antenna components, circuit components or drive circuit components.

14. The semiconductor package device as claimed in claim 1, wherein a distance between the at least one of the second metal lines and one of the two adjacent first metal lines is greater than or equal to twice the second width.

15. The semiconductor package device as claimed in claim 14, wherein the distance between the at least one of the second metal lines and the one of the two adjacent first metal lines is greater than or equal to twice the second width and less than or equal to three times the second width.

16. The semiconductor package device as claimed in claim 1, wherein the first metal lines comprise dummy structures.

17. The semiconductor package device as claimed in claim 1, wherein a length of one of the two adjacent first metal lines is greater than or equal to 16 times the second width.

18. The semiconductor package device as claimed in claim 17, wherein the length of one of the two adjacent first metal lines is greater than or equal to 16 times the second width and less than or equal to 20 times the second width.

19. The semiconductor package device as claimed in claim 1, wherein the second metal lines comprise signal routings.

* * * * *